US006689698B2

(12) United States Patent
Zhigang et al.

(10) Patent No.: US 6,689,698 B2
(45) Date of Patent: Feb. 10, 2004

(54) METHOD FOR ETCHING A SILICIDED POLY USING FLUORINE-BASED REACTIVE ION ETCHING AND SODIUM HYDROXIDE BASED SOLUTION IMMERSION

(75) Inventors: Song Zhigang, Singapore (SG); Guo Zhi Rong, Singapore (SG); Shailesh Redkar, Singapore (SG); Hua Younan, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 41 days.

(21) Appl. No.: 10/012,297

(22) Filed: Nov. 13, 2001

(65) Prior Publication Data

US 2003/0092276 A1 May 15, 2003

(51) Int. Cl.[7] .............................................. H01L 21/302
(52) U.S. Cl. ....................... 438/706; 438/710; 438/712; 438/720; 134/1.1; 134/1.2
(58) Field of Search ................................. 438/706, 710, 438/712, 720, 721, 682, 592, 591; 134/1.1, 1.2, 1.3; 216/83

(56) References Cited

U.S. PATENT DOCUMENTS

| | | | | | |
|---|---|---|---|---|---|
| 3,791,848 A | * | 2/1974 | DeAngelo | ..................... | 216/35 |
| 6,147,002 A | * | 11/2000 | Kneer | ......................... | 438/692 |
| 6,284,662 B1 | * | 9/2001 | Mikagi | ........................ | 438/706 |
| 6,495,394 B1 | * | 12/2002 | Nakata et al. | .............. | 438/107 |

* cited by examiner

Primary Examiner—Nadine G. Norton
Assistant Examiner—Lan Vinh

(57) ABSTRACT

A method for removing a silicide poly on an integrated circuit (IC) chip. Specifically, one embodiment of the present invention discloses a method for exposing a gate oxide layer with a fluorine based reactive ion etching (F-based RIE) process and immersion in a sodium hydroxide based solution. The F-based RIE damages a silicide layer that covers a polysilicon gate layer. Damage to the silicide layer allows for penetration of chemicals to a polysilicon gate layer. Immersion of the IC chip in the sodium hydroxide based solution etches away the polysilicon gate layer and lifts off the silicide layer without altering an underlying gate oxide layer. Also, another embodiment uses a solution including sodium hydroxide and sodium chloride. As such, failure analysis of the gate oxide layer can proceed without concern for damage due to the removal process.

24 Claims, 8 Drawing Sheets

METHOD FOR ETCHING A SILICIDED POLY USING FLUORINE-BASED REACTIVE ION ETCHING AND SODIUM HYDROXIDE BASED SOLUTION IMMERSION

BACKGROUND OF THE INVENTION

1. Field of the Invention

The present invention relates to the field of failure analysis in semiconductor manufacturing. Specifically, the present invention relates to removing a silicide poly in a sample preparation for failure analysis in semiconductor manufacturing.

2. Related Art

Failure analysis and sample preparation is an important step in providing a detailed inspection of the physical characteristics of an integrated circuit (IC) fabricated on a semiconductor chip (IC chip). More particularly, proper preparation of the IC chip is an important issue when inspecting the gate oxide region for failure analysis.

However, silicide application in sub-quarter micron ultra large scale integration (ULSI) technology poses a major problem in the analysis of gate oxide failures. Typical construction of the IC chip with a silicide application includes a gate oxide layer under a polysilicon gate layer. The silicide layer covers the underlying polysilicon gate and gate oxide layer.

Previous methods for removing the silicide poly also removed or attacked the underlying gate oxide layer, which was the focus of the failure analysis. For example, in a wet etching method using hydrofluoric (HF) acid, the HF acid readily removes the silicide layer. However, the HF acid also seriously undercuts the underlying gate oxide layer, thus compromising any attempts at failure analysis of the gate oxide layer.

One solution for removing the silicide layer is provided for in a chlorine-based reactive ion etching system (Cl-based RIE). However, the high toxicity of chlorine creates system related problems, such as, safety concerns, increased cost for toxic removal and disposal costs, environmental concerns due to the toxicity of chlorine, etc. Specifically, the typical RIE system does not accommodate use of a Cl-based RIE process. This requires the use and added cost of a specialized chamber for using chlorine in the Cl-based RIE process.

Similarly, a sodium hydroxide (NaOH) solution provides for etching of the polysilicon gate layer with good selectivity of the gate oxide layer, that is the gate oxide layer remains unaffected by the NaOH solution. However, the NaOH solution is ineffective for removing the silicide layer which covers the polysilicon gate layer. As such, only using NaOH for sample preparation is ineffective in exposing the gate oxide layer for failure analysis.

Alternatively, using a lapping process to remove the silicide layer could expose the polysilicon gate layer for etching with a NaOH solution. However, the uneven features of lapping processes typically used in failure analysis labs make the NaOH etching of the polysilicon gate layer non-uniform over the entire ULSI integrated circuit.

Thus, a need exists for a method to provide for clean removal of the silicide layer and the underlying polysilicon gate layer for gate oxide defect characterization. Another need exists for a method using less-toxic materials for increased safety and profitability.

SUMMARY OF THE INVENTION

The present invention provides a method for the clean removal of a cobalt silicide layer and the underlying polysilicon gate layer for gate oxide defect characterization. Also, the present invention provides a method that achieves the above accomplishment and which also provides for increased safety and increased profitability through the use of less-toxic materials.

Specifically, one embodiment discloses a method for exposing a gate oxide layer that includes de-layering the IC chip to the metal-1 (M-1) layer located just above the semiconductor device that includes the cobalt silicide layer. The M-1 layer is removed using a parallel lapping process typically used in failure analysis laboratories.

In another embodiment, the present invention discloses a method for exposing a gate oxide layer with a fluorine based reactive ion etching (F-based RIE) process and immersion in a sodium hydroxide based solution. The F-based RIE damages a cobalt silicide layer that covers a polysilicon gate layer, and creates a multitude of pinholes in the silicide layer. Pinholes in the cobalt silicide layer allow for penetration of chemicals into the polysilicon gate layer. Immersion of the IC chip in the sodium hydroxide based solution etches away the polysilicon gate layer and lifts off the cobalt silicide layer without altering an underlying gate oxide layer. As such, failure analysis of the gate oxide layer can proceed without concern for damage due to the removal process.

In one embodiment of the present invention, the solution of sodium hydroxide is heated to approximately 50° C. to 55° C. before immersing the sample in the solution. After immersion, the sample is rinsed in de-ionized water and blown dry to complete the sample preparation.

Additionally, another embodiment uses a solution including sodium hydroxide (NaOH) and sodium chloride (NaCl) for balancing the etching rates for p-type and n-type polysilicon gate layers. This solution of NaOH and NaCl is most useful in ULSI technologies of 0.15 micrometers or below 0.15 micrometers.

These and other objects and advantages of the present invention will no doubt become obvious to those of ordinary skill in the art after having read the following detailed description of the preferred embodiments which are illustrated in the various drawing figures.

DETAILED DESCRIPTION OF THE INVENTION

Figure 1:
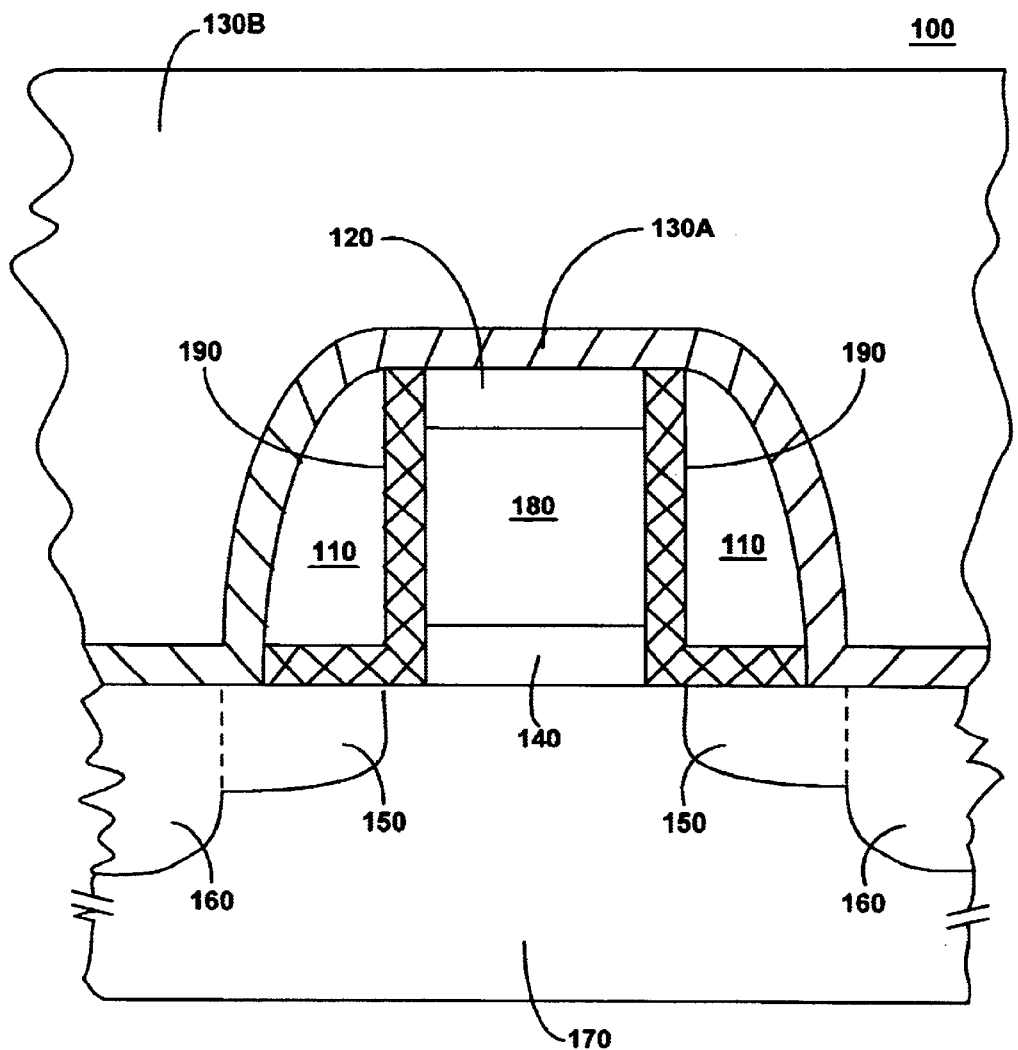
FIG. 1 illustrates an exemplary semiconductor device sample showing the cobalt silicided layer and the underlying polysilicon gate layer.

Reference will now be made in detail to the preferred embodiments of the present invention, a method for the clean removal of a silicide layer and the underlying polysilicon gate layer for failure analysis purposes, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention provides a method for the clean removal of a silicide layer and the underlying polysilicon gate layer for failure analysis purposes (e.g., gate oxide defect characterization). Also, the present invention provides a method that achieves the above accomplishment and which also provides for increased safety and increased profitability through the use of less-toxic materials.

For purposes of clarity and illustration, the following detailed description will specifically refer to a cobalt silicide embodiment. However, it will be understood that the present invention is well suited to use with silicides other than cobalt silicide.

Embodiments of the present invention provide for a fluorine-based reactive ion etching (F-based RIE) and sodium hydroxide (NaOH) solution immersion method for cobalt silicide poly de-processing. Use of both the F-based RIE and NaOH solution facilitates a clean removal of the cobalt silicide poly over a large area without attacking the structure of the underlying gate oxide. Also, since the NaOH solution is nontoxic, preparation of the sample for failure analysis is relatively inexpensive and safe. This provides for a reliable method to characterize gate oxide defects in failure analysis.

Additionally, although embodiments of the present invention specifically refer to characterization of gate oxide defects in failure analysis, it will be understood that the present invention is well suited for preparation of semiconductor chip samples for failure analysis of other critical structural areas. For example, chip samples could be prepared for inspecting the channel region under the gate oxide layer using the method as described in embodiments of the present invention. Other critical structural areas for inspection also include liner layers, gate layer, source region, drain region, any structural areas where a silicide area covers or prevents ready access to a polysilicon region, etc.

FIG. 1 illustrates an exemplary semiconductor device 100. Any conventional means may be used for formation of the semiconductor device 100. Semiconductor device 100 lies on a semiconductor substrate 170 that may include other semiconductor devices forming an integrated circuit (IC) chip. The IC chip may be of ultra-large-scale integration (ULSI) chip dimensions.

The semiconductor device 100 of FIG. 1 includes a lightly doped drain (LDD) region 150 and an accompanying source/drain region 160 that is of higher doping concentrations. The regions 150 and 160 can be n-type or p-type depending on the type of the semiconductor device 100.

Semiconductor device 100 includes a gate oxide layer 140 that overlies the substrate 170. Gate oxide layer 140 is a dielectric. A gate layer 180 overlies the gate oxide layer 140. In one embodiment, gate layer 180 may be formed using a silicon layer such as polysilicon. The gate layer 180 may also be referred to as a gate electrode 180.

Semiconductor device 100 includes a metal silicide layer 120 that is composed of cobalt silicide, in one embodiment of the present invention. The cobalt silicide layer 120 overlays the polysilicon gate layer 180. Semiconductor device 100 also includes sidewall spacers 110 and a liner oxide layer 190 between the sidewall spacers 110 and the gate layer 180.

In another embodiment of the present invention, a nitride layer 130A overlays the cobalt silicide layer 120. The nitride layer 130A may also extend to the source and drain regions 160 in another embodiment of the present invention. The nitride layer 130A is typically used for etch-stopping purposes. At the top of the nitride layer 130A, there is a layer of dielectric 130B.

Figure 2:
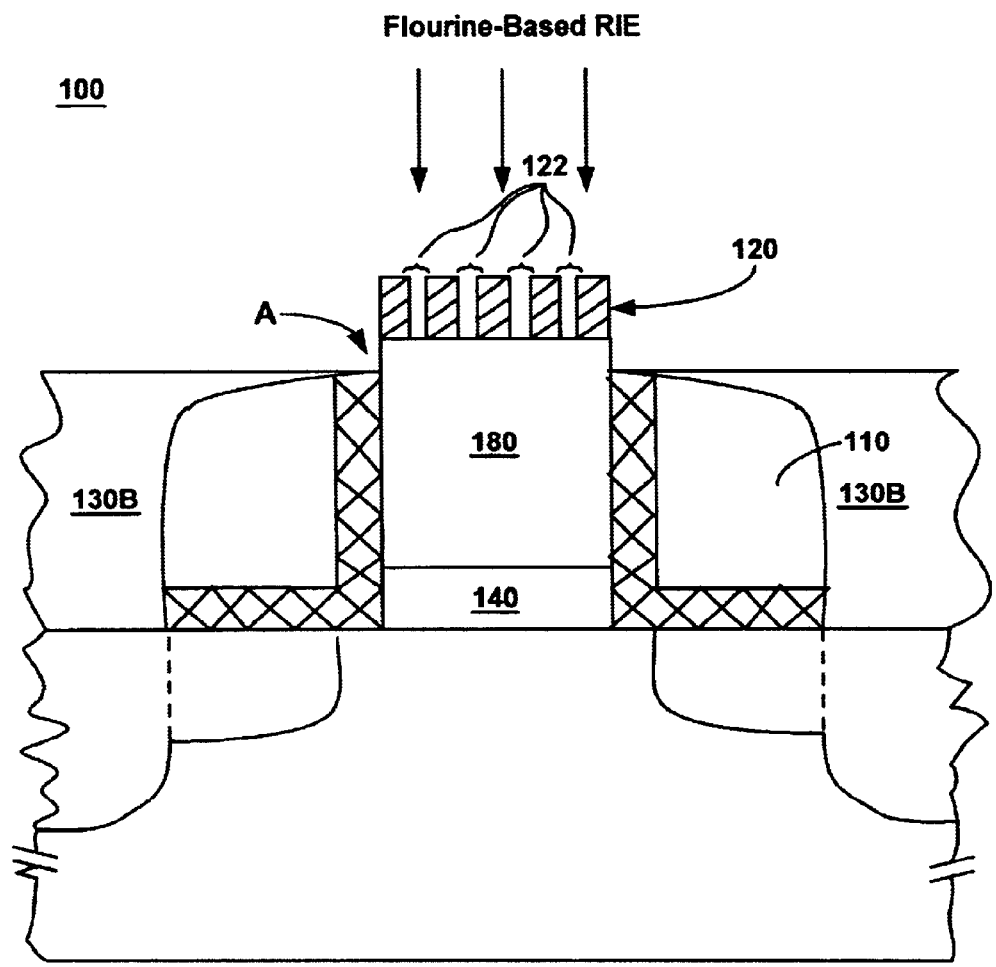
FIG. 2 illustrates an exemplary semiconductor device undergoing fluorine-based reactive ion etching for damaging the cobalt silicide layer, in accordance with one embodiment of the present invention.

FIG. 2 illustrates the semiconductor device 100 undergoing a F-based RIE process, in accordance with one embodiment of the present invention. The F-based RIE system exposes and damages the cobalt silicide layer 120 that overlays the polysilicon gate layer 180. The F-based RIE does not damage or affect the structural integrity of the gate oxide layer 140.

Pinholes, typically shown as 122, are created at the surface of the cobalt silicide layer 120 as represented in FIG. 2. These pinholes result from RIE reactions with the cobalt silicide surface and changes in the chemical composition of the cobalt silicide layer 120. As a result, the underlying polysilicon gate layer 180 is susceptible to penetration and attack through the damaged cobalt silicide layer 120.

In another embodiment of the present invention, portions of the nitride layer 130A, dielectric 130B, liner oxide layer 190, and portions of the sidewall spacer 110 are removed during the etching process using F-based RIE. The layers 130A and 130B are partially removed with certain thin oxide left to cover the active region. Also, this partial etching allows for exposure to the cobalt silicide layer 180, and for direct exposure for etching the polysilicon layer 180 (see access point A in FIG. 2).

Figure 3A:
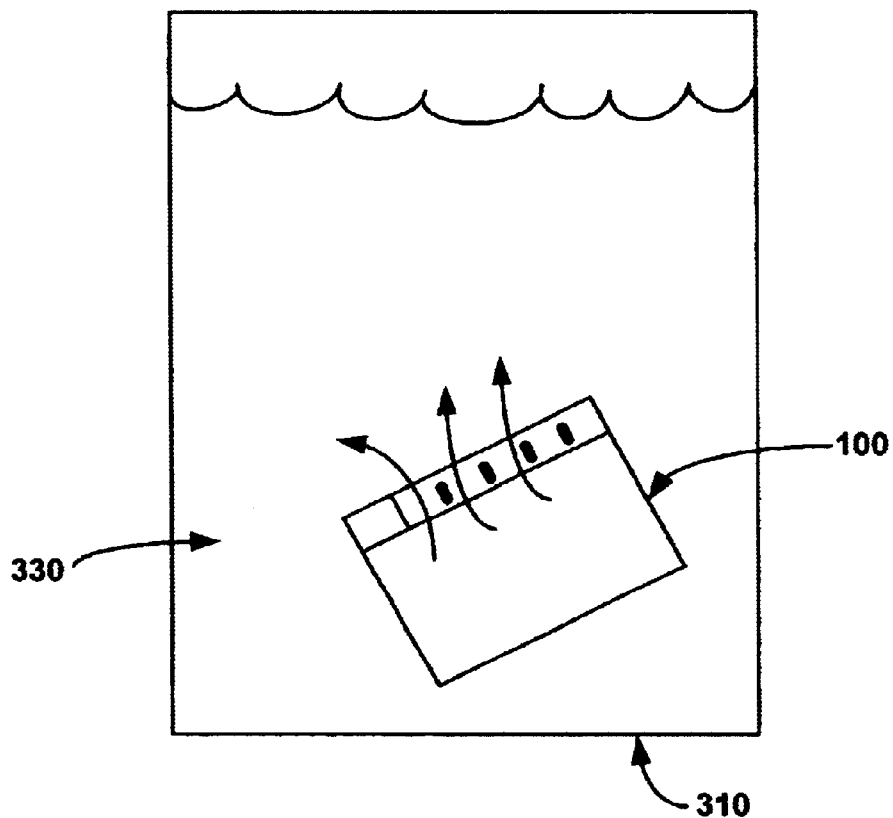
FIG. 3A illustrates a sodium hydroxide based solution for etching away the polysilicon gate layer, in accordance with one embodiment of the present invention.

FIG. 3A illustrates a sodium hydroxide (NaOH) solution 330 for etching away the polysilicon gate layer of either n-type or p-type material, in accordance with one embodiment of the present invention. System 300 includes a container 310 that contains a solution 330 of NaOH. The sample containing semiconductor device 100 is immersed in the solution 330 for purposes of etching away the polysilicon gate layer 180.

The etching times of the sample containing device 100 in the NaOH solution is adjusted depending on the doping types and concentrations of the semiconductor device 100. For example, the etching rate for a n-type material with higher concentrations in the polysilicon gate layer 180 is faster than a p-type material with higher concentrations in the polysilicon gate layer 180. Etching times of approximately five minutes allow enough etching to cleanly remove the polysilicon gate layer 180 and to lift off the cobalt silicide layer 120.

Figure 4:
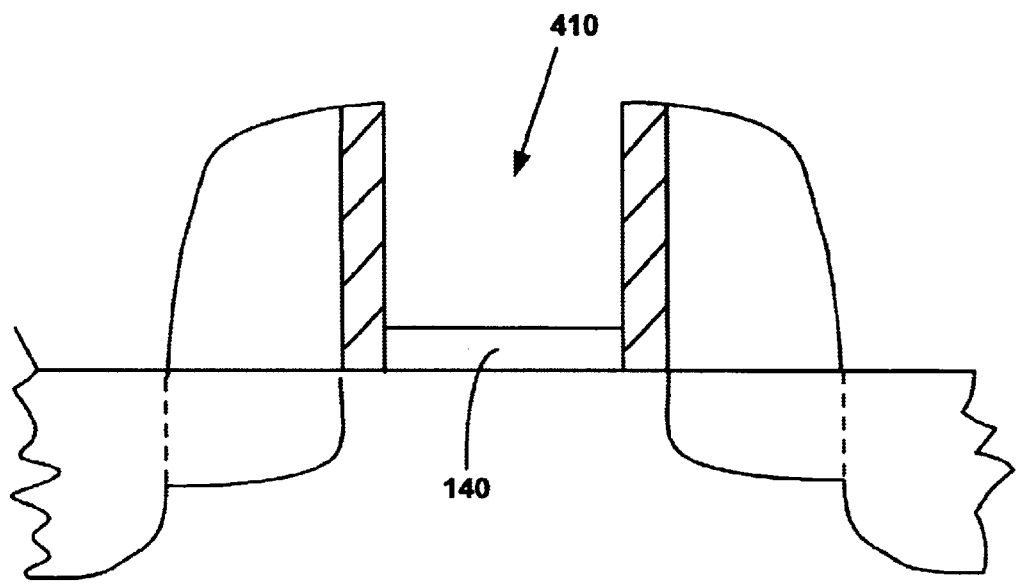
FIG. 4 illustrates an exemplary semiconductor device showing a clean removal of the cobalt silicide layer and the polysilicon gate layer, in accordance with one embodiment of the present invention.

FIG. 4 illustrates an exemplary semiconductor device showing a clean removal of the cobalt silicide layer 120 and the polysilicon gate layer 180, in accordance with one embodiment of the present invention. FIG. 4 illustrates the IC chip after immersion in the NaOH solution for etching away the cobalt silicide layer and the polysilicon gate layer. As shown, the area 410 that contains the polysilicon gate layer 180 is clear and completely exposes the underlying gate oxide layer 140.

In one embodiment of the present invention, the solution 330 contains a one molar concentration of NaOH. In another embodiment, the NaOH solution 330 is heated approximately between the temperatures of 50° C. to 55° C. The sample containing the semiconductor device 100 is then immersed in the solution 330 for a period necessary to cleanly remove the polysilicon gate layer.

In another embodiment of the present invention, the method incorporating F-based RIE and NaOH immersion solution to remove the cobalt silicide layer and polysilicon gate layer is ideal for IC chips with critical dimensions of 0.18 micrometers or longer. Additionally, the F-based RIE and NaOH immersion solution is able to effectively clean a polysilicon gate layer composed of either an n-type (e.g., phosphorous doped) or p-type (e.g., boron doped) material.

As ULSI technology progresses into the sub-quarter micron dimension, removal of the p-type polysilicon gate layers becomes problematic. For high concentration of dopants in the polysilicon gate layer, as is used in creating semiconductor devices with dimensions of 0.15 microns, the etching rates are different for n-type and p-type doped polysilicon gate layers. At these dimensions, using a strictly NaOH etching solution leaves a residue in the p-type polysilicon gate layer as is shown in FIG. 5A.

Figure 5A:
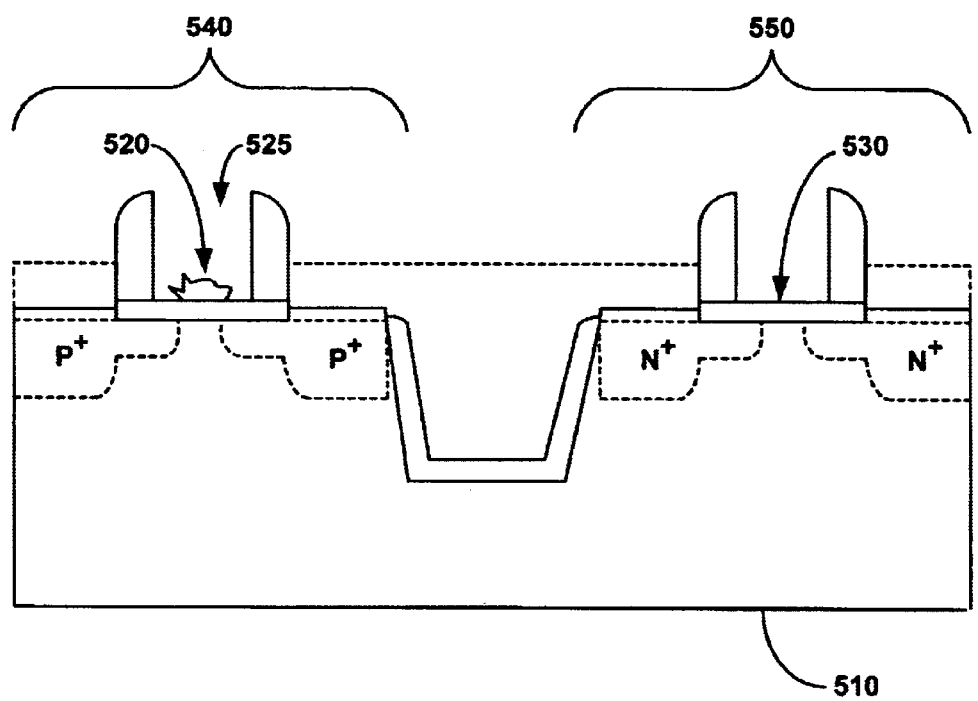
FIG. 5A illustrates an exemplary semiconductor substrate showing unbalanced etching rates for p-type and n-type semiconductor devices when using a sodium hydroxide etching solution, in accordance with one embodiment of the present invention.

FIG. 5A illustrates a semiconductor substrate 510 in an IC chip 500 that includes p-type semiconductor device 540 and an n-type semiconductor device 550. The semiconductor device 540 and 550 have dimensions of 0.15 microns. FIG. 5A illustrates the IC chip 500 after immersion in a NaOH solution for etching away the cobalt silicide layer and the polysilicon gate layer. As shown, a residue 520 remains in the p-type area 525 that contained the polysilicon gate electrode for the p-type semiconductor device 540, which prevents adequate failure analysis of the underlying gate oxide layer. On the other hand, the area 530 that contained the polysilicon gate electrode for an n-type semiconductor device 550 is entirely clear.

To balance the etch rates of the n-type and p-type polysilicon gate layers, sodium chloride (NaCl) is added to the NaOH etching solution. The mixed solution of the NaCl and NaOH equalizes the etching rates of the n-type and p-type doped polysilicon gate layers. Immersion in this NaCl and NaOH solution produces a clean gate oxide layer without any residue for both n-type (e.g., NMOS) and p-type (e.g., PMOS) semiconductor devices. As such, the F-based RIE and immersion solution (NaCl and NaOH) are able to effectively clean polysilicon gate layers composed of n-type (e.g., phosphorous doped) or p-type (e.g., boron doped) materials.

Figure 3B:
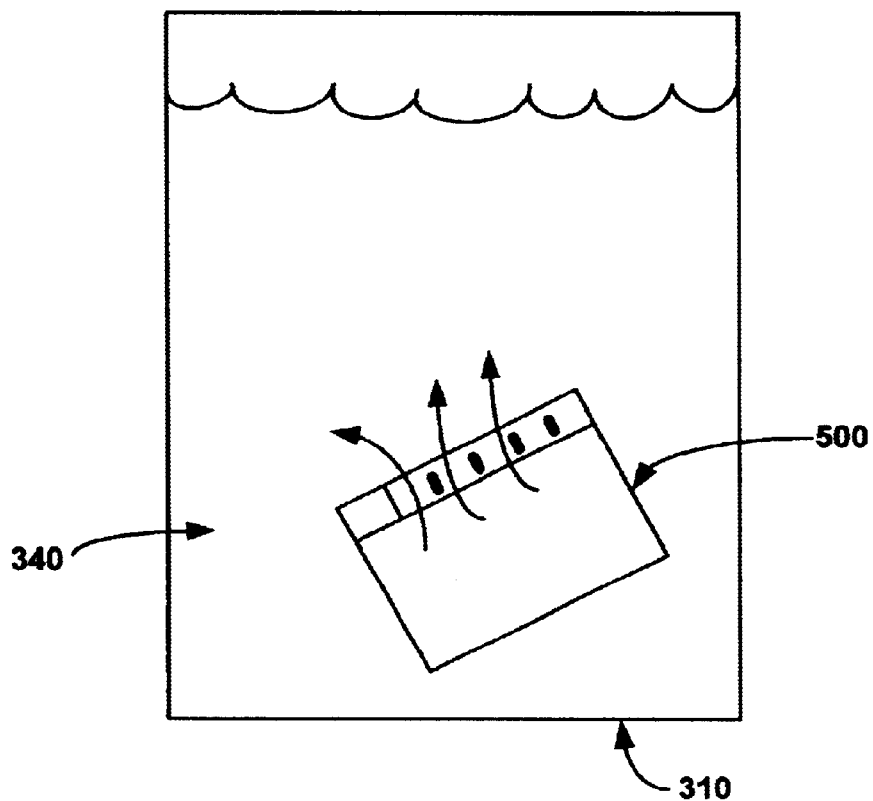
FIG. 3B illustrates a solution including sodium hydroxide and sodium chloride for etching away the polysilicon gate layer, in accordance with one embodiment of the present invention.

FIG. 3B illustrates a solution including sodium hydroxide and sodium chloride for etching away the polysilicon gate layer, in accordance with one embodiment of the present invention.

System 350 includes a container 310 that contains a solution 340 of NaOH and NaCl. The sample containing IC chip 500 is immersed in the solution 340 for purposes of etching away polysilicon gate layers (e.g., polysilicion gate layers in devices 540 and 550).

Figure 5B:
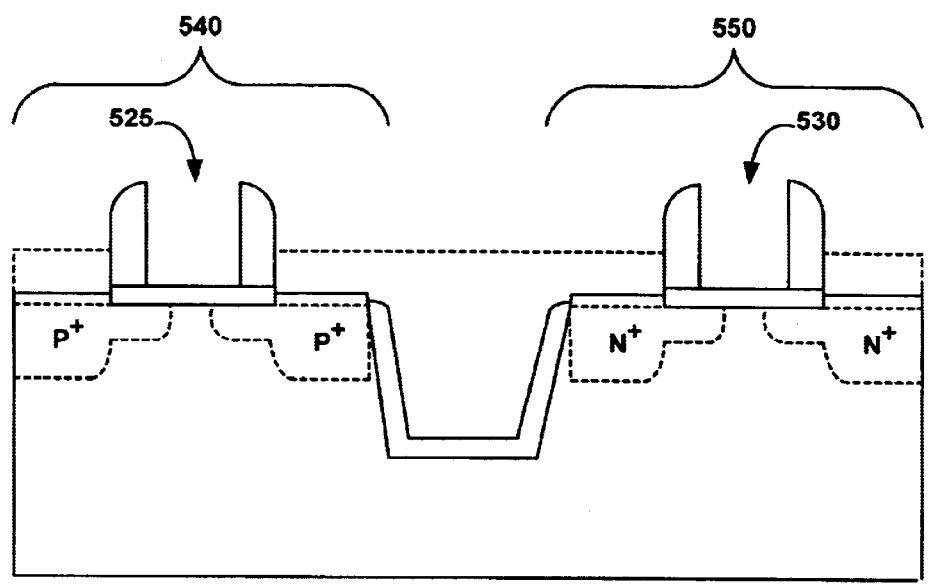
FIG. 5B illustrates an exemplary semiconductor substrate showing balanced etching rates for p-type and n-type semiconductor device when using a solution including sodium hydroxide and sodium chloride, in accordance with one embodiment of the present invention.

FIG. 5B illustrates an exemplary semiconductor substrate showing balanced etching rates for p-type and n-type semiconductor devices when using a solution including sodium hydroxide and sodium chloride, in accordance with one embodiment of the present invention. The semiconductor devices 540 and 550 have dimensions of 0.15 microns.

FIG. 5B illustrates the IC chip after immersion in the solution including NaOH and NaCl for etching away the cobalt silicide layer and the polysilicon gate layer. As shown, a p-type polysilicon gate layer 525 for the p-type semiconductor device 540 is clear. Additionally, the n-type polysilicon gate layer 530 for the n-type semiconductor device 550 is clear.

In one embodiment of the present invention, the solution 340 contains a concentration consisting of 5.8 grams of NaCl for every 100 ml of one molar NaOH (5.8 g NaCl: 100 ml 1M NaOH). In another embodiment, the solution 340 including the NaOH and NaCl is heated in a thermal chunk to approximately between 50° C. to 55° C. The sample containing the IC chip 500 is then immersed in the solution 340 for a period necessary to cleanly remove the polysilicon gate layers in the IC chip 500.

The method incorporating F-based RIE and immersion solution including NaOH and NaCl to remove a cobalt silicide layer and polysilicon gate layer is described in the present embodiment for IC chips with critical dimensions of 0.15 microns. However, embodiments of the present invention also include IC chips or samples greater than 0.15 microns for immersion in a solution of NaCl and NaOH in order to remove the cobalt silicide layer and polysilicon gate layer.

Figure 6:
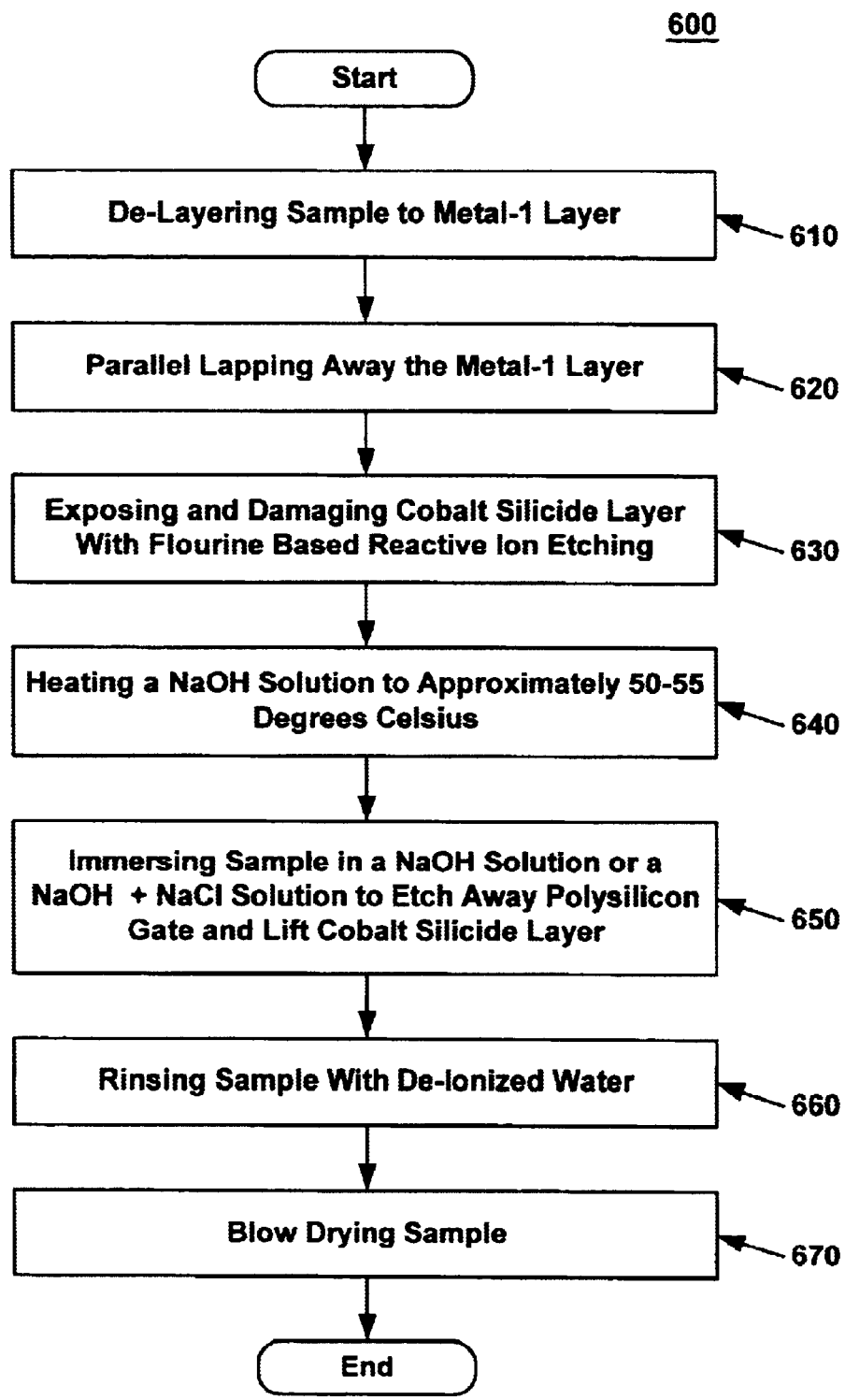
FIG. 6 is a flow diagram illustrating steps in a method for the clean removal of a cobalt silicide layer and the underlying polysilicon gate layer for gate oxide defect characterization.

Maintaining gate oxide integrity is a main concern in sub-quarter micron semiconductor devices on an IC chip. Selective removal of a high concentration doped polysilicon gate layer without attacking the underlying gate oxide layer is an indispensable and critical step for gate oxide failure analysis. FIG. 6 illustrates an exemplary flow chart 600 for using a F-based RIE and NaOH-based etching solution in etching away a polysilicon gate area and lifting off a cobalt silicide layer, in accordance with one embodiment of the present invention.

As shown in step 610 of flow chart 600, the first step of the present embodiment of the present invention de-layers an IC chip sample to the metal-1 (M-1) layer located just above the semiconductor device layer. This is done with a normal de-processing method typically used in failure analysis laboratories. In one embodiment, the IC chip sample may be of ULSI dimensions.

As recited in step 620 of flow chart 600, the present embodiment removes the M-1 layer using a lapping process. This lapping process can be any removal process typically used in failure analysis laboratories, such as a chemical mechanical polishing (CMP) process that is manually or mechanically implemented. In one embodiment of the present invention, the lapping process is a parallel lapping process.

As recited in step 630 of flow chart 600, the present embodiment then places the IC chip sample in a F-based RIE system in order to damage the cobalt silicide layer that overlays the polysilicon gate layer in a semiconductor device located in the IC chip. The F-based RIE exposes and damages the cobalt silicide layer to create pinholes making the underlying polysilicon gate layer susceptible to penetration, leakage, and attack through the damaged cobalt silicide layer.

The F-based RIE system also etches away dielectric to expose the cobalt silicide layer and polysilicon layer. Thus, the dielectric is partially removed while leaving a thin dielectric to cover the active region.

As shown in step 640 of flow chart 600, the present embodiment heats the solution for immersing the IC chip sample approximately between 50° C. to 55° C. In another embodiment, the solution includes a one molar (1M) concentration of NaOH. In still another embodiment, the solution includes NaOH and NaCl (e.g., 5.8 g NaCl: 100 ml 1M NaOH).

As shown in step 650 of flow chart 600, the present embodiment immerses the IC chip sample in a solution of sodium hydroxide (NaOH) to etch away the polysilicon gate layer and lift off the cobalt silicide layer. Alternatively, in another embodiment of the present invention, the IC chip sample is immersed in a solution that includes NaOH and NaCl to etch away the polysilicon gate layer and lift off the cobalt silicide layer.

As recited in step 660 of flow chart 600, the present embodiment rinses the IC chip sample with de-ionized water. Then, the present embodiment blows dry the IC chip sample in step 670.

While the methods of embodiments illustrated in flow chart 600 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Although the present invention is described with specific concentrations and temperatures, the present invention is well suited to other embodiments incorporating various other temperature ranges and concentrations.

A method for exposing a gate oxide layer with a fluorine based reactive ion etching (F-based RIE) process and immersion in a sodium hydroxide based solution for removing a cobalt silicide layer on an integrated circuit (IC) chip, is thus described. While the present invention has been described in particular embodiments, it should be appreciated that the present invention should not be construed as limited by such embodiments, but rather construed according to the below claims.

What is claimed is:

1. A method for removing a silicide poly comprising the steps of:
   a) damaging a silicide layer on a semiconductor device with a fluorine based reactive ion etching (F-based RIE) process, said silicide layer covering a polysilicon gate layer, said semiconductor device located on an integrated circuit (IC) chip;
   b) immersing said IC chip in a solution of sodium hydroxide (NaOH) to etch away said polysilicon gate layer and lift off said silicide layer;
      i) prior to step b), adding sodium chloride (NaCl) to said solution, such that said solution includes both NaOH and NaCl; and
      ii) heating said solution in a thermal chunk to between the temperatures of 50° C. to 55° C.

2. The method as described in claim 1, comprising the further steps of:
   c) rinsing said IC chip with de-ionized water; and
   d) blowing dry said IC chip.

3. The method as described in claim 1, wherein said step b) further comprises:
   immersing said IC chip in a one molar (1M) sodium hydroxide (NaOH) solution.

4. The method as described in claim 1, wherein said step i) further comprises:
   adding 5.8 grams of NaCl for every 100 ml of one molar NaOH in said solution.

5. The method as described in claim 1, wherein step a) further comprises:
   damaging a cobalt silicide layer.

6. The method as described in claim 1, comprising the further step of:
   etching away a dielectric layer to expose said silicide layer, said dielectric layer covering said silicide layer.

7. The method as described in claim 1, comprising the further steps of:
   i) prior to said step a), de-layering said IC chip to a metal-1 layer (M-1 layer), said M-1 layer above said silicide layer in said semiconductor device; and
   ii) removing said M-1 layer using a lapping process.

8. The method as described in claim 7, wherein said step i) further comprises:
   removing said M-1 layer using a parallel lapping process.

9. A method for exposing a gate oxide layer for failure analysis comprising the steps of:
   a) de-layering an integrated circuit (IC) chip to a metal-1 layer (M-1 layer), said M-1 layer directly above a silicide layer located on a semiconductor device;
   b) removing said M-1 layer using a lapping process;
   c) damaging said silicide layer on said semiconductor device with a fluorine based reactive ion etching (F-based RIE) process, said silicide layer covering a polysilicon gate layer that is over said gate oxide layer; and
   d) immersing said IC chip in a solution of sodium hydroxide (NaOH) in order to etch away said polysilicon gate layer and lift off said silicide layer.

10. The method as described in claim 9, wherein step c) further comprises:
    damaging a cobalt silicide layer.

11. The method as described in claim 9, wherein said step b) further comprises:
    removing said M-1 layer using a parallel lapping process.

12. The method as described in claim 9, comprising the further steps of:
    e) rinsing said IC chip with de-ionized water; and
    f) blowing dry said IC chip.

13. The method as described in claim 9, comprising the further step of:
    prior to said step d), heating said solution of NaOH to between the temperatures of 50° C. to 55° C.

14. The method as described in claim 9, wherein said step d) further comprises:
    immersing said IC chip in a one molar (1M) NaOH solution.

15. The method as described in claim 9, comprising the further step of:
    prior to said step c), etching away a dielectric layer to expose said silicide layer, said dielectric layer covering said silicide layer.

16. The method as described in claim 9, comprising the further steps of:
   i) prior to said step d), adding sodium chloride (NaCl) to said solution, such that said solution includes both NaOH and NaCl; and
   ii) heating said solution in a thermal chunk to between the temperatures of 50° C. to 55° C.

17. The method as described in claim 16, wherein said step i) further comprises:
   adding 5.8 grams of NaCl for every 100 ml of one molar NaOH.

18. A method for removing a silicide poly comprising the steps of:
   a) damaging a silicide layer on a semiconductor device with a fluorine based reactive ion etching (F-based RIE) process, said silicide layer covering a polysilicon gate layer, said semiconductor device located on an integrated cirduit (IC) chip; and
   b) immersing said IC chip in a solution that includes both sodium hydroxide (NaOH) and sodium chloride (NaCl) to etch away said polysilicon gate layer and lift off said silicide layer.

19. The method as described in claim 18, comprising the further steps of:
   i) prior to said step a), de-layering said IC chip to a metal-1 layer (M-1 layer), said M-1 layer above said cobalt silicide layer; and
   ii) removing said M-1 layer using a lapping process.

20. The method as described in claim 19, wherein said step ii) further comprises:
   removing said M-1 layer using a parallel lapping process.

21. The method as described in claim 18, comprising the further steps of:
   c) rinsing said IC chip with de-ionized water; and
   d) blowing dry said IC chip.

22. The method as described in claim 18, comprising the further step of:
   i) prior to said step b), heating said solution in a thermal chunk to between the temperatures of 50° C. to 55° C.

23. The method as described in claim 18, wherein said method further comprises:
   prior to said step b), adding 5.8 grams of NaCl for every 100 ml of one molar NaOH in said solution.

24. The method as described in claim 18, comprising the further step of:
   etching away a dielectric layer to expose said silicide layer, said dielectric layer covering said silicide layer.

* * * * *